United States Patent [19]

Suzuki et al.

[11] Patent Number: 4,975,689
[45] Date of Patent: Dec. 4, 1990

[54] OPERATION DISPLAY METHOD AND APPARATUS FOR VARIABLES OF AN OSCILLOSCOPE

[75] Inventors: Kiichirou Suzuki, Tokyo; Norio Yamada, Funabashi, both of Japan

[73] Assignee: Iwatsu Electric Company, Ltd., Tokyo, Japan

[21] Appl. No.: 283,132

[22] Filed: Dec. 12, 1988

[30] Foreign Application Priority Data

Dec. 30, 1987 [JP] Japan ................... 62-336560

[51] Int. Cl.$^5$ ............................................. G09G 5/00
[52] U.S. Cl. ...................... 340/706; 340/709; 324/121 R
[58] Field of Search .............. 324/121 R; 340/706, 340/709, 722; 364/424.05, 188, 130, 141, 190; 200/4; 273/148 B

[56] References Cited

U.S. PATENT DOCUMENTS

| | | | |
|---|---|---|---|
| 4,225,758 | 9/1980 | Kondo et al. | 200/4 |
| 4,544,885 | 10/1985 | Takahashi | 324/121 R |
| 4,587,419 | 5/1986 | Kim | 250/221 |
| 4,812,829 | 3/1989 | Ebina et al. | 340/706 |
| 4,812,832 | 3/1989 | Oishi et al. | 340/706 |

OTHER PUBLICATIONS

IBM Technical Disclosure Bulletin by Manka, vol. 20, No. 11A, Apr. 1978, p. 4475.

*Primary Examiner*—Jeffery A. Brier
*Attorney, Agent, or Firm*—Oblon, Spivak, McClelland, Maier & Neustadt

[57] ABSTRACT

An operation display method and apparatus for variables of an oscilloscope including a rotary-push mechanism connected with a rotary knob is disclosed. When the rotary knob is rotated clockwise a little, a right directional arrow is displayed on a CRT. Then e.g. a cursor is shifted to the right on the CRT by a division every pushing the rotary knob. When the rotary knob is rotated clockwise or counterclockwise, the cursor is shifted a little to the right or the left. When the knob is rotated counterclockwise in the precise adjustment, a left directional arrow is displayed on the CRT. Then the cursor can shifted to the left on the CRT by a division every pushing the knob. Other variables can be operated in the same manner.

2 Claims, 3 Drawing Sheets

OPERATION DISPLAY METHOD AND APPARATUS FOR VARIABLES OF AN OSCILLOSCOPE

BACKGROUND OF THE INVENTION

1. Field of the Invention

The present invention relates to an operation display method and apparatus for various variables of an oscilloscope.

The invention is particularly concerned with a method and an apparatus for displaying operation of variables of cursors to be shifted, delaying sweep times to be set, positions of traces to be adjusted, hold-off times to be set or the like in an oscilloscope.

2. Description of the prior Art

Two main methods are employed for operating variables of an oscilloscope.

It is the first method to obtain a rotated direction and a rotated angle from a rotary encoder connected with a rotary knob to be rotated on a front panel of an oscilloscope.

It is the second method to employ a seesaw switch. When the right of the seesaw switch is pushed, a positive increase of the output voltage from the circuit including the seesaw switch is proportioned to time period while the seesaw switch is pushed. When the left of that is pushed, a negative increase of the output from the circuit is proportioned to a time period while the seesaw switch is pushed. Another seesaw switch is used to obtain an output voltage which is proportioned to a pressure pushing the seesaw switch in which many switches are stacked to be switched on in series corresponding with the pressure.

The rotary encoder connected with the rotary knob has a problem to be solved. Obtaining a large variable value (e.g. a cursor shift range) with a certain rotated angle causes that precise adjustment to be difficult. Obtaining a small variable value with a certain rotated angle requires many roatations of the knob.

The seesaw switch has a like problem. For example, when a cursor arrives at the destination points on a CRT by pushing the right of the seesaw switch to shift the cursor to the right, the pushing operation is stopped. However the cursor has passed the destination point on the CRT. An employment of a small variable value per a unit time period to solve such a problem requires a long time for the cursor to arrive at the destination points on the CRT. It is therefore inconvenient for a user to operate an oscilloscope.

The stacked switches sensing the pressure can solve such a problem.

However the cost of the stacked switch is expensive because of its complicated structure.

SUMMARY OF THE INVENTION

An object of the present invention is to provide an improved operation display method and apparatus for variables of an oscilloscope.

Another object of the present invention is to provide an improved apparatus employing a rotary-push mechanism connected with a rotary knob.

When the rotary knob is rotated clockwise a little, a right directional arrow is displayed on a CRT. Then e.g. a cursor is shifted to the right on the CRT by a division for every push of the rotary knob. When the rotary knob is rotated clockwise or counterclockwise, the cursor is shifted to the right or the left a little. Thus a precise adjustment is executable. When the knob is rotated counterclockwise in the precise adjustment, a left directional arrow is displayed on the CRT. Then the cursor can be shifted to the left on the CRT by a division for every push of the knob. Other variables can be operated in the same manner.

Other objects, advantages and features of the present invention will become apparent to those having ordinary skill in the art upon a reading of the following description when taken in conjunction with the accompanying drawings.

BRIEF DESCRIPTION OF THE DRAWINGS

The principle, construction and operation of the present invention will be clearly understood from the following detailed description taken in conjunction with the accompanying drawings, in which.

DESCRIPTION OF THE PREFERRED EMBODIMENTS

Figure 1:
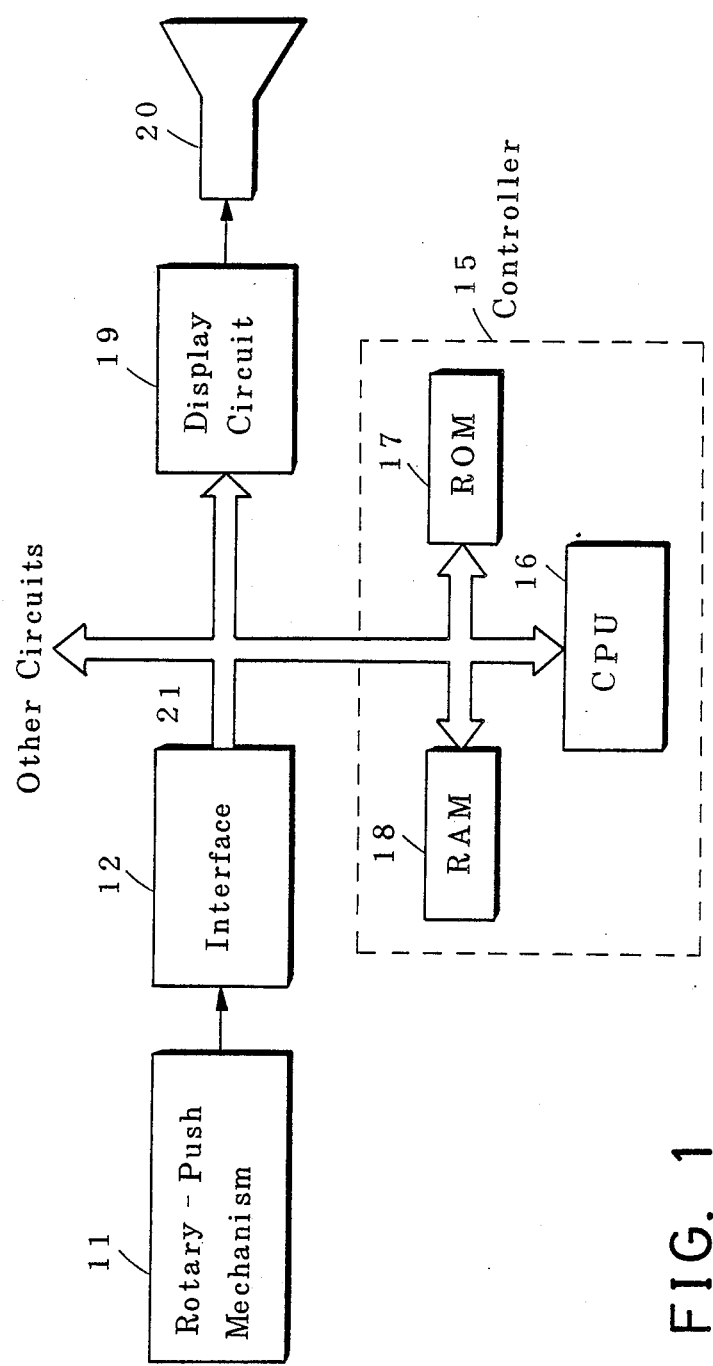
FIG. 1 is a block diagram illustrating an embodiment in accordance with the present invention.

With reference to FIG. 1 showing an embodiment of the present invention constructed as an operation display apparatus for variables of an oscilloscope, reference numeral 11 denotes a rotary-push mechanism which comprises e.g. a rotary encoder and a push switch for detecting a rotated angle and a pushed action.

Outputs from the rotary-push mechanism are applied to a controller 15 as a bus signal 21 through an interface 12. The controller 15 includes a CPU (central processing unit) 16, a ROM (read-only memory) 17 and a RAM (random-access memory) 18, in which both memories are needed for operations of the CPU 16.

Rotation angles and pushing actions from the rotary-push mechanism 11 are read by the controller 15 which delivers outputs as a bus signal 21 to a display circuit 19 to display informations required for operations on a CRT (cathode ray tube) 20.

The bus signal 21 is also applied to other circuits not shown which are a vertical amplifier, a sweep circuit and so on included in an oscilloscope.

Figure 2:
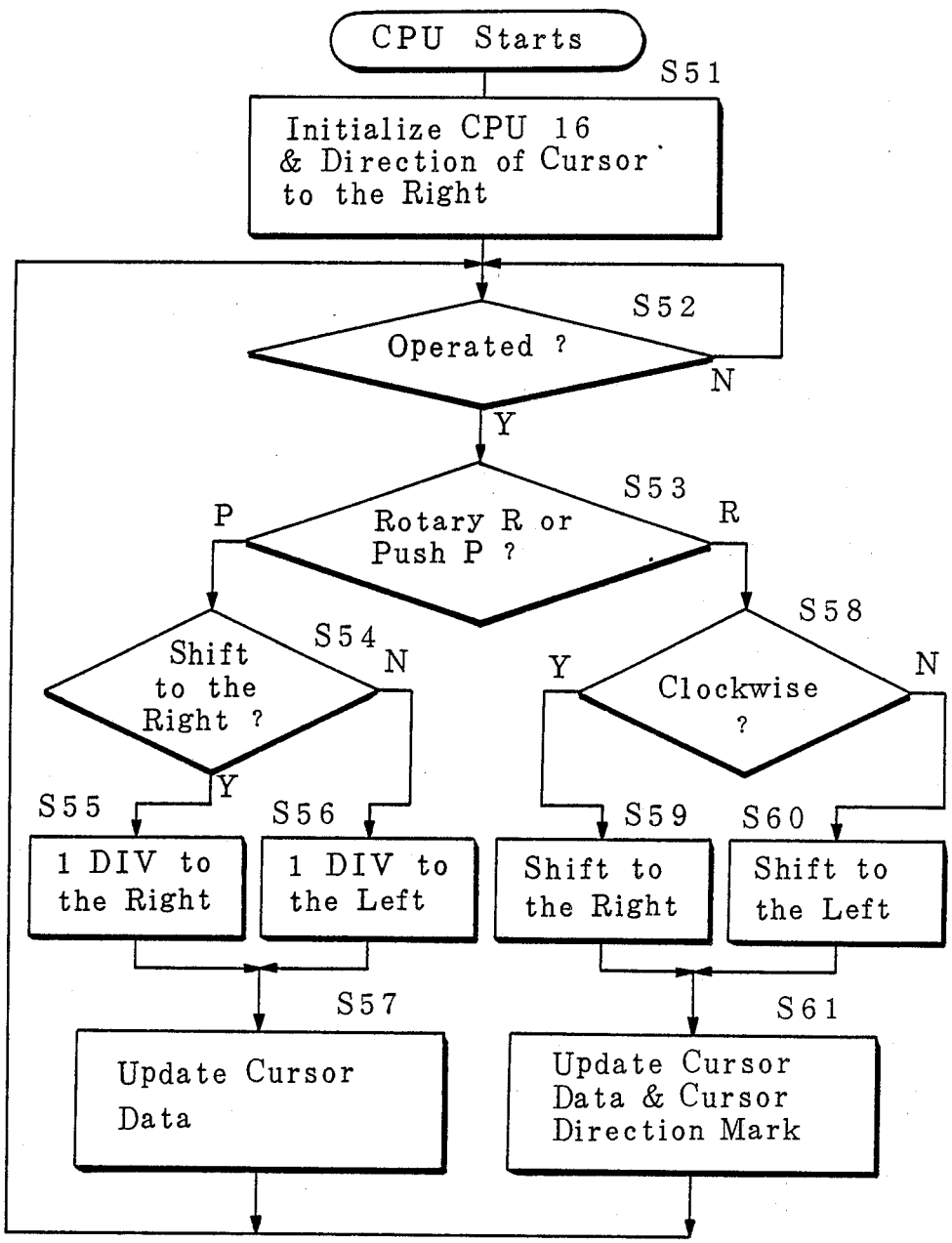
FIG. 2 is a flowchart to explain an operation of FIG. 1.
Figure 3:
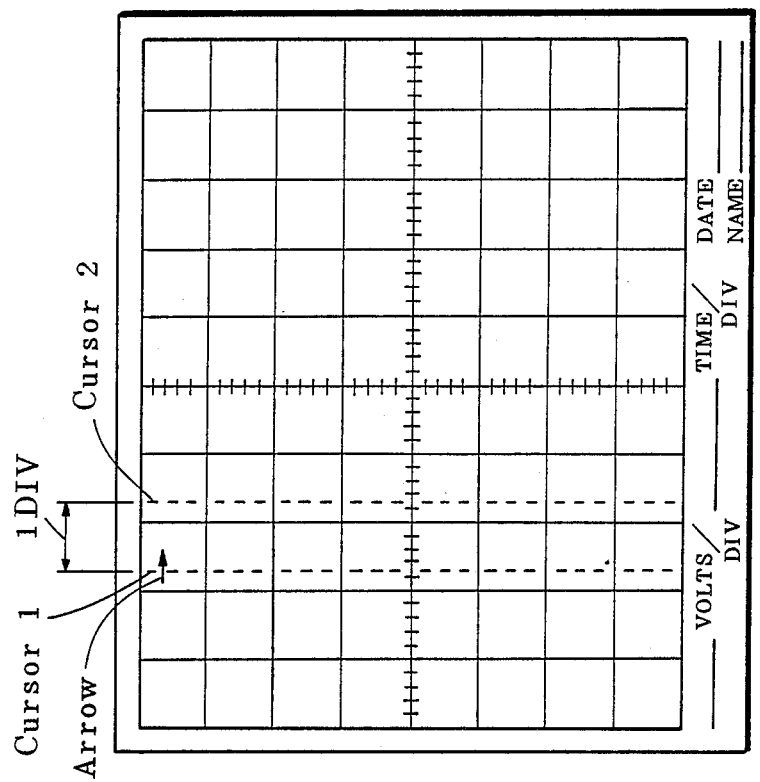
FIG. 3 is a display on a CRT.

FIG. 2 illustrates an operation flow for displaying e.g. cursors to be shifted to the right or the left on the CRT 20. FIG. 3 illustrates the display of a cursor and an arrow on the CRT 20.

When the CPU 16 starts, the CPU 16 is initialized and a cursor is set at the end of the left on the CRT 20, in which a right directional arrow indicating that the cursor can be shifted by a division to the right for every pushing action of the knob connected with the rotary push mechanism (S51, FIG. 2).

When the rotary-push mechanism 11 is operated (S52Y), it is judged whether the rotary encoder R is rotated or the push switch P is pushed (S53). When pushed (S53P), it is asked whether the cursor has to be shifted to the right or the left (S54). When the right (S54Y), the cursor 1 is shifted to the right by a division as the cursor 2 shown in FIG. 3 (S55). When the left (S54N), the arrow directs to the left and the cursor is shifted by a division to the left (S56). Then cursor data in the RAM 18 are updated (S57) to be set on stand-by (S52).

When the rotary encoder is rotated in the step S53 (S53R), it is judged whether the rotary direction is clockwise or counterclockwise (S58). When clockwise (S58Y), the arrow directs to the right and the cursor can be shifted a little to the right on the CRT 20 in proportion to the rotated angle of the rotary encoder which operates as a vernier (S59). When counterclockwise (S58N), the arrow directs to the left and the cursor can be shifted a little to the left on the CRT 20 in proportion to the rotated angle of the rotary encoder (S60). Then data of the cursor and the direction of the arrow in the RAM 18 are updated (S61) to be set on stand-by (S62).

By such operation and display, the cursor can quickly be shifted to the precise destination points on the CRT 20.

In the above-description the cursor, which is shiftable to the right and the left, is shown.

In such a manner, a cursor, which is vertically shiftable, can also be displayed on the CRT 20. It is obvious from the abovementioned that the invention is usable for shifting waveforms displayed on the CRT, setting a delaying sweep time, a hold-off time, or other variables.

While the preferred form of the present invention has been described, it is to be understood that modifications will be apparent those skilled in that art without departing from the spirit of the invention.

The scope of the invention, therefore, is to be determined solely by the following claims.

What is claimed is:

1. An operation display method for variables of an oscilloscope comprising:
    adjusting a variable by rotating a rotatable knob to control a display of said oscilloscope as a vernier;
    varying said variable step by step by a predetermined value for every push of said rotatable knob to control said display of said oscilloscope, in which a direction of varying of said variable on said display is determined by a rotated direction of said rotatable knob just before said rotatable knob is pushed; and
    displaying said rotated direction on said display.

2. An operation display apparatus for variables of an oscilloscope comprising:
    rotary-push means for obtaining a vernier output, which varies a variable in a small range, by being rotated to control a display of said oscilloscope and a main output varied by a predetermined value for every push thereof to control said display of said oscilloscope, in which said main output varies said variable step by step by a predetermined value; and
    control means for receiving said vernier output and said main output and for controlling a display of a variable direction of said variable to be varied by said main output, and a display of a value of said variable which is varied by said vernier output and said main output on said display of said oscilloscope on which waveforms to be measured are still being displayed.

* * * * *